United States Patent [19]

Pfiester

[11] Patent Number: 4,988,632

[45] Date of Patent: Jan. 29, 1991

[54] BIPOLAR PROCESS USING SELECTIVE SILICON DEPOSITION

[75] Inventor: James R. Pfiester, Austin, Tex.

[73] Assignee: Motorola, Inc., Schaumburg, Ill.

[21] Appl. No.: 459,845

[22] Filed: Jan. 2, 1990

[51] Int. Cl.[5] .......................................... H01L 21/265
[52] U.S. Cl. ........................................ 437/31; 437/89;
  437/151; 437/162; 437/233; 437/150; 437/27;
  148/DIG. 123; 148/DIG. 124; 148/DIG. 9
[58] Field of Search .................... 437/31, 151, 89, 162,
  437/233, 27; 148/DIG. 124, DIG. 123

[56] References Cited

U.S. PATENT DOCUMENTS

| 4,072,975 | 2/1978 | Ishitani | 148/DIG. 167 |
| 4,464,825 | 8/1984 | Ports | 148/DIG. 123 |
| 4,495,010 | 1/1985 | Kranzer | 437/162 |
| 4,547,231 | 10/1985 | Hine | 437/89 |
| 4,717,677 | 1/1988 | McLaughlin et al. | 437/233 |
| 4,786,615 | 11/1988 | Liaw | 437/90 |
| 4,879,255 | 11/1989 | Deguchi et al. | 437/31 |
| 4,908,324 | 3/1990 | Nihira et al. | 437/162 |
| 4,910,170 | 3/1990 | Motozima et al. | 437/31 |
| 4,948,745 | 8/1990 | Pfiester | 437/233 |

FOREIGN PATENT DOCUMENTS

| 0024459 | 2/1980 | Japan | 437/89 |
| 0193324 | 10/1985 | Japan | 437/89 |
| 0089620 | 5/1986 | Japan | 437/89 |
| 0174366 | 7/1988 | Japan | 437/89 |

OTHER PUBLICATIONS

Furumura et al., "Selective Growth of Polysilicon", J. Electrochem. Soc.: Solid-State Science and Tech., Feb. 86, vol. 133, #2, pp. 379-383.
Mieno et al., "Selective Doped Polysilicon Growth", J. Electrochem. Soc.: Solid-State Science and Tech., Nov. 1987, vol. 134, #11, pp. 2862-2867.
J. Middelhoer et al., "Polycrystalline Silicon as a Diffusion Source and Interconnect Layer in I²L Realizations", IEEE J. of Solid-State Circuits, vol. 5c-12, #2, Apr. 77, pp. 135-138.

Primary Examiner—Brian E. Hearn
Assistant Examiner—Kevin Picardat
Attorney, Agent, or Firm—John A. Fisher

[57] ABSTRACT

A process is disclosed for fabricating bipolar transistors having self aligned and closely spaced polycrystalline silicon base and emitter electrodes. The process is especially amenable to integration with the fabrication of MOS transistors to form BiMOS integrated circuits. In accordance with one embodiment of the invention, a P type polycrystalline silicon layer is deposited overlying an N type silicon substrate. The polycrystalline silicon layer is patterned to form base contact electrodes and to leave exposed a portion of the surface of the N-type substrate. An electrically insulating layer is formed overlying the polycrystalline silicon base contacts and the exposed silicon substrate. Sidewall spacers are formed on the electrically insulating layer at the sidewalls of the base contact electrode. After etching the electrically insulating material which is not protected by the sidewall spacers, polycrystalline silicon is deposited on the exposed surface of the N type substrate by a process of selective deposition to form an emitter contact electrode. Ion implantation is then used to form an active base and emitter beneath the emitter contact electrode. Dopant impurities are diffused from the base contact electrode into the underlaying silicon substrate to form an extrinsic base region. The sidewall spacers are removed to expose the surface of the silicon substrate which lies between the intrinsic and extinsic base regions. P type dopant impurities are implanting into this exposed region to form a linking base connecting the intrinsic and extrinsic base regions.

10 Claims, 3 Drawing Sheets

BIPOLAR PROCESS USING SELECTIVE SILICON DEPOSITION

RELATED APPLICATIONS

This application is related to application Ser. No. 309,589 by Pfiester et al filed Feb. 13, 1989 and commonly assigned with the present application.

BACKGROUND OF THE INVENTION

The trend in integrated circuit design and fabrication is to shrink the size of individual devices to accommodate a greater number of devices on a substrate of a given size. As this trend continues, it becomes difficult to achieve the small feature sizes and the alignment between features which are necessary to fabricate highly reliable and high yielding devices. This problem is especially acute as the complexity of the device types used to implement a circuit function increases. The increasingly complex device types require an increase in the number of process steps used to fabricate the device and each of these process steps must be carefully and precisely interrelated. A single channel MOS device can be fabricated using only a few masking operations. The number of masking operations is increased considerably in fabricating CMOS structures. As the device structure becomes more complex and requires, for example, lightly doped drains (LDD), threshold adjust implants, and the like, more and more masking steps are required. When MOS is combined with bipolar to form a BiMOS or even BiCMOS structure, the number of processing steps increases even more. With these very complex structures it becomes even more important that critical device regions be self aligned and as the devices become smaller, that these critical regions be defined by other than conventional optical lithography. In the above referenced application, Ser. No. 309,589, a process is disclosed for the fabrication of an inverse T lightly doped drain (ITLDD) MOS structures that is highly manufacturable. A need existed, however, for a process for making small geometry bipolar transistors, and especially for the integration of such bipolar transistors with MOS transistors.

It is therefore an object of this invention to provide an improved process for fabricating a bipolar transistor.

It is another object of this invention to provide an improved process for fabricating bipolar and MOS transistors integrated in a BiMOS process.

BRIEF SUMMARY OF THE INVENTION

The foregoing and other objects and advantages of the invention are achieved through a process which utilizes the selective deposition of silicon to form an emitter electrode. In accordance with one embodiment of the invention a method is provided in which a silicon substrate is provided and a layer of silicon of opposite conductivity type is deposited overlaying the surface of the substrate. The silicon layer is patterned to form base contact electrodes and to expose a first portion of the substrate surface. An electrically insulating layer is formed overlaying the silicon base contact electrodes and the exposed portion of the substrate surface. Sidewall spacers are formed to overlay the ends or sidewalls of the base contact electrodes. The electrically insulating layer is removed from the substrate surface using the sidewall spacers as etch masks and silicon is deposited by a process of selective deposition onto the exposed surface area to form an emitter contact electrode. The surface area overlaid by the selectively deposited silicon emitter electrode is doped with impurities to form an intrinsic base region and a emitter region. Dopant impurities are diffused from the base contact electrode into the substrate surface to form an extrinsic base region. The sidewall spacers are removed to expose that portion of the substrate surface lying between the emitter contact electrode and base contact electrode. That exposed portion of the substrate surface is doped with conductivity determining dopant impurities to form a linking base region connecting the intrinsic and extrinsic base regions. Closely spaced and self aligned base and emitter electrodes are thus provided as are small geometry emitter and base regions. The fabrication process is also capable of simultaneously forming an MOS transistor to thus fabricate a BiMOS device.

DETAILED DESCRIPTION OF PREFERRED EMBODIMENT

The process in accordance with the invention provides for the fabrication of a bipolar transistor for use in an integrated circuit. The process may also be applied to the fabrication of a bipolar transistor in a BiMOS circuit. Accordingly, the inventive process will be illustrated and described with reference to the fabrication of an NPN transistor. Additional steps necessary for the simultaneous fabrication of an N channel MOS transistor will be described briefly, as those steps are more fully disclosed in application Ser. No. 309,589 filed on Feb. 13, 1989, the disclosure of which is incorporated herein by reference thereto. The illustrative process can be modified or extended, in known manner, for the fabrication of PNP transistors, complimentary bipolar transistors, or bipolar transistors with complimentary MOS (CMOS) devices. The term "MOS" is herein used as a generic term, and is not intended to be limited to metal gate devices, nor to devices having an oxide insulator.

FIGS. 1–8 illustrate, in broken cross section, process steps in accordance with a preferred embodiment of the invention by which a NPN bipolar transistor and an N channel MOS transistor are fabricated.

Figure 1:
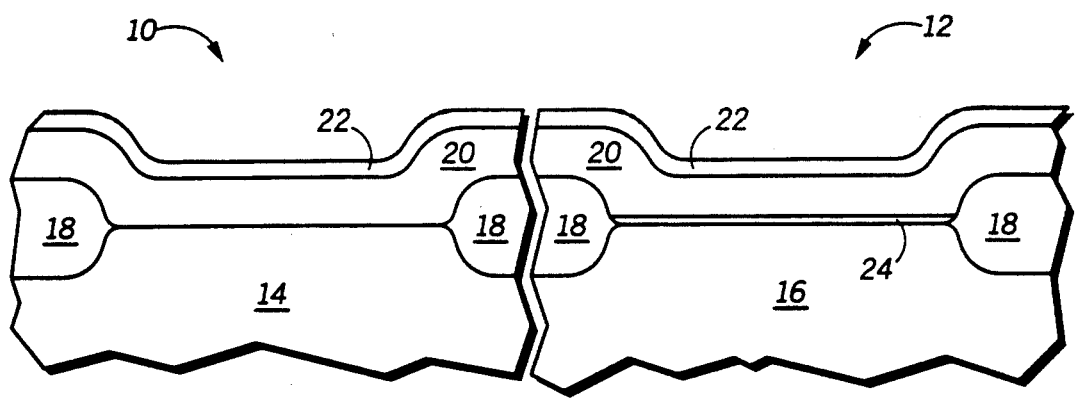
FIGS. 1–8 illustrate, in broken cross section, process steps in accordance with one embodiment of the invention by which BiMOS devices are fabricated.

FIG. 1 illustrates the initial steps, in accordance with the invention, for fabricating an NPN transistor in a device area 10 and an N channel MOS transistor in a device area 12. The NPN transistor is formed in an N type surface region 14 of a monocrystalline silicon substrate. The N channel MOS transistor is fabricated in a P type surface region 16 formed in that same silicon substrate. Appropriate isolation means such as a thick field oxide 18 provides electrical isolation between devices in the circuit. Additional isolation may be provided by junction isolation, or the like. Surface region 14 may be underlaid by a heavily doped N type buried layer region (not shown) and both of regions 14 and 16 may be formed in an epitaxial layer formed on a silicon substrate, usually a P type silicon substrate. The structure illustrated in FIG. 1 may already be provided with a collector contact (not shown) which, for example, can be formed by a deep, heavily doped N type diffusion which extends from the surface of region 14 down to and intersects with the buried layer. The deep collector contact would be seen, for example, in a cross section perpendicular to the cross section shown in FIG. 1.

In accordance with the invention, a layer of heavily doped P type silicon 20 is deposited over the structure and a layer 22 of low temperature oxide (LTO) or other dielectric material is deposited over the silicon layer. Silicon layer 20 is preferably a layer of polycrystalline silicon having a thickness of about 150 nanometers which is deposited by chemical vapor deposition. Layer 20 can also be a layer of amorphous silicon which is deposited by chemical vapor deposition, sputtering, or the like. Hereafter layer 20 will be referred to as a polycrystalline silicon layer. Polycrystalline silicon layer 20 can be deposited as a heavily doped layer or can be deposited as an undoped layer which is subsequently doped by ion implantation or the like. Layer 20 will eventually form the base contact electrodes of the NPN transistor and will serve as a doping source for the extrinsic base portion of the NPN transistor. The LTO layer 22 is preferably deposited by chemical vapor deposition to a thickness of 50-100 nanometers. Layers 20 and 22 are part of the fabrication of the NPN transistor and are not a part of the MOS transistor. Accordingly, it is advantageous to form a thin oxide layer 24 over the surface of region 16 prior to the deposition of polycrystalline silicon layer 20. Layer 24 will aid in the subsequent removal of polycrystalline layer 20 without damaging or doping the surface of region 16.

Figure 2:
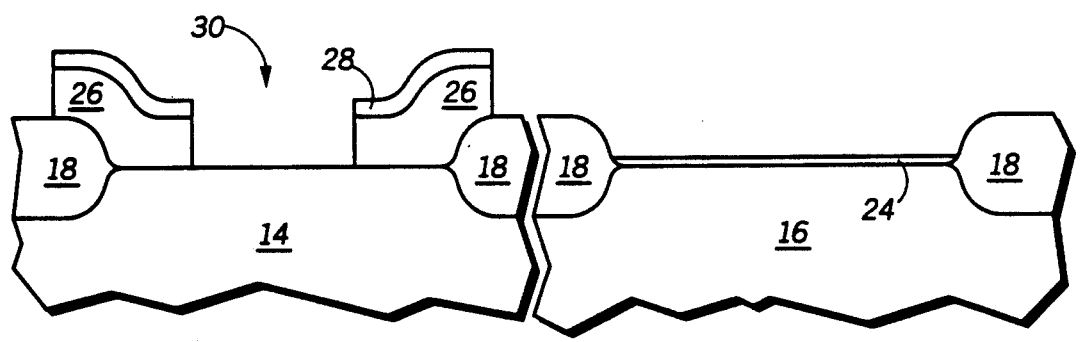

As illustrated in FIG. 2, polycrystalline silicon layer 20 and the overlaying layer 22 of LTO are patterned using conventional photolithography to form base contact electrodes 26 with an overlaying layer of oxide 28. Opening 30 through polycrystalline silicon layer 26 exposes a portion of surface region 14 in which the active portion of the NPN transistor will be formed. At the same time the base contact electrodes are patterned, polycrystalline silicon layer 20 and overlying layer 22 of LTO are removed from device area 12.

Figure 3:
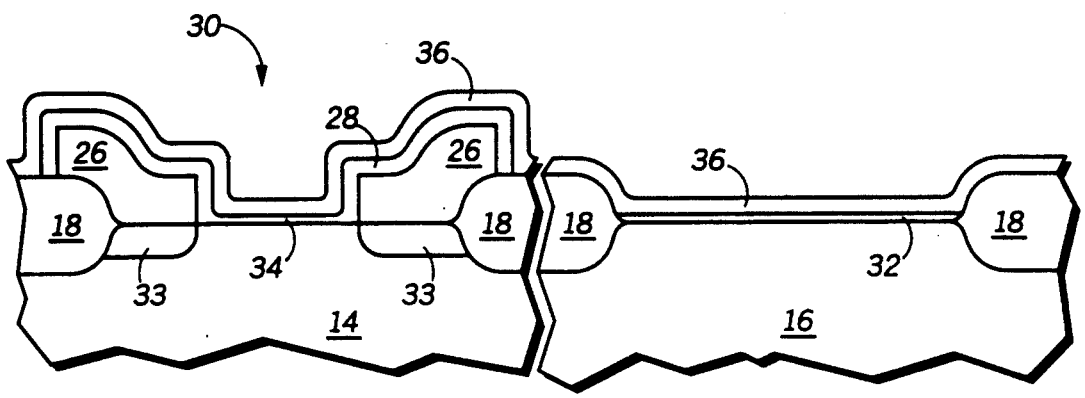

Oxide layer 24 is removed from the surface of region 16 and a new gate oxide layer 32 is formed, preferably by thermal oxidation, on the surface of region 16. The same oxidation step forms an oxide layer 34 over the portion of surface region 14 which is exposed through opening 30, oxidizes the exposed sidewalls of base contact electrodes 26, and increases the thickness of oxide layer 28 which overlays the base contact electrodes. The thermal cycle associated with the oxidation step causes the diffusion of P-type dopant impurities from heavily doped base contact electrodes 26 into the underlying portions of surface region 14 to form P-type extrinsic base regions 33. If oxide layers 32 and 34 are formed by a low temperature deposition, or the like, the formation of extrinsic base regions 33 can be formed by a separate thermal redistribution step, either at this time in the process, or at a later time. Then, as illustrated in FIG. 3, a thin layer 36 of polycrystalline silicon is deposited over oxide layers 32, 34, and 28, preferably to a thickness of about 50 nanometers. Polycrystalline silicon layer 36 is preferably deposited by chemical vapor deposition. Again, layer 36 is described as a polycrystalline silicon layer but can also be a layer of amorphous silicon. Layer 36 is used later in the process for fabricating the MOS transistor in device area 12, but does not serve a purpose in the fabrication of the bipolar transistor.

At this point in the process the structure may be selectively ion implanted to adjust the doping at the surface of surface area 16 to adjust the threshold voltage of the MOS transistor to be formed. Following the optional threshold voltage implant, polycrystalline silicon layer 36 is selectively removed from device area 10 in which the bipolar transistors are being fabricated. The selective removal is accomplished using photoresist masking and conventional etching with the etch stopping at oxide layer 28.

Figure 4:
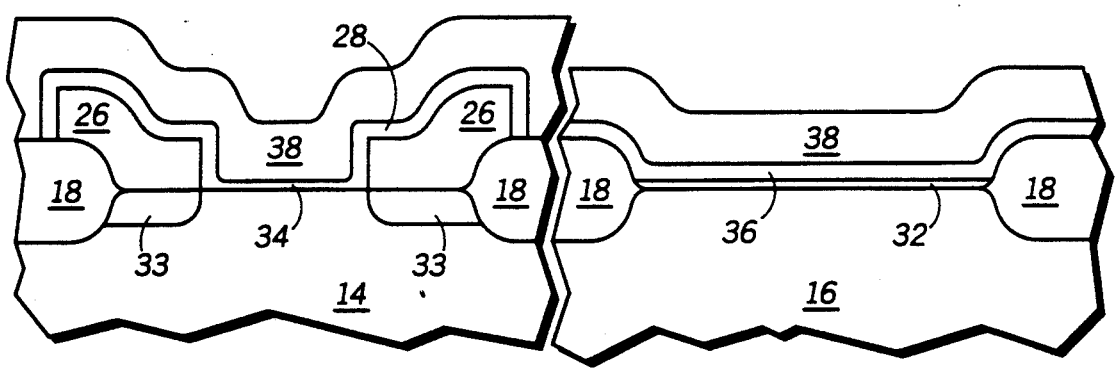

In accordance with the invention, and as illustrated in FIG. 4, a layer of silicon nitride 38 or other insulating material is deposited over layers 28, 34, and 36. Layer 38 is preferably silicon nitride deposited by chemical vapor deposition to a thickness of about 300 nanometers. Other materials may also be used, but they must etch at a significantly different rate than does layer 28 and they must have the property, as explained more fully below, that they do not nucleate the selective deposition of silicon.

Figure 5:
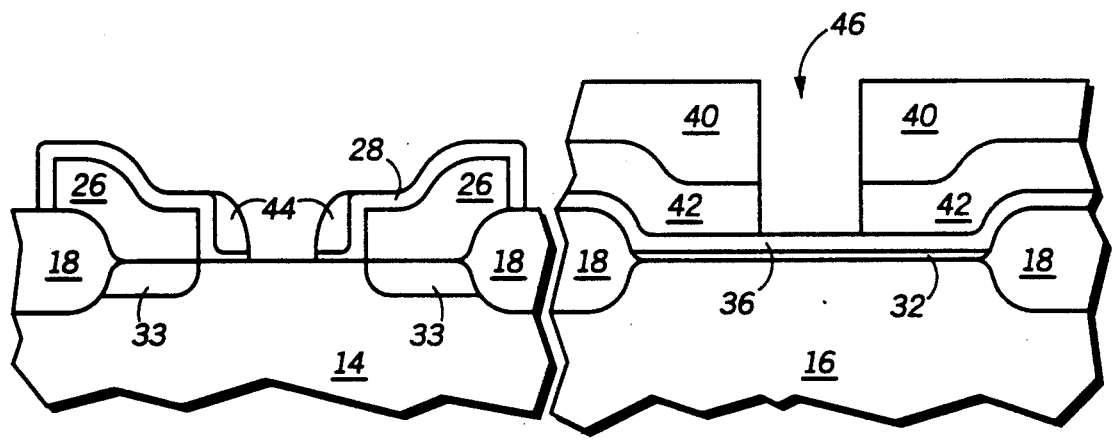
Figure 6:
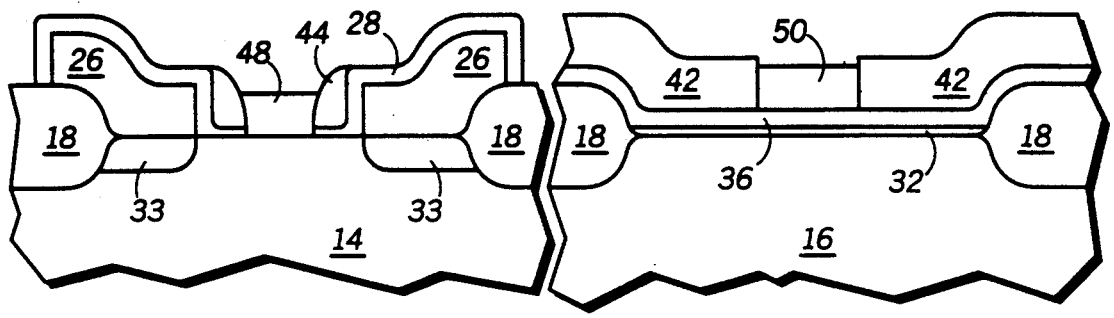
Figure 7:
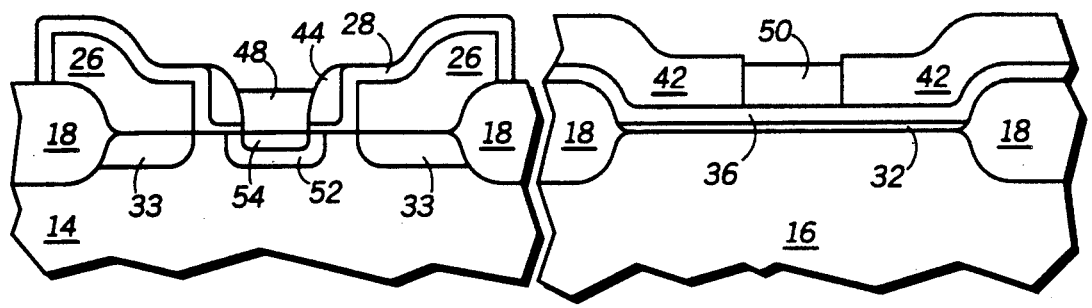

As illustrated in FIG. 5, nitride layer 38 is covered with a patterned photoresist layer 40 and then is anisotropically etched to form a barrier layer 42 and sidewall spacers 44. The anisotropic etching forms sidewall spacers 44 without the use of a mask. Opening 46 which overlays surface area 16 will be the eventual location of the gate electrode of the MOS transistor being fabricated. In the same or subsequent anisotropic etching step the thin oxide layer 34 is removed from the surface of surface area 14 using the sidewall spacers 44 as an etch mask. During this etching step the thicker oxide 28 overlaying the polycrystalline silicon base contact electrodes protects those electrodes from the etching. The thicker layer 28 results from the combination of the deposited LTO oxide layer in combination with the thermal oxidation which formed oxide layer 34 and oxide layer 32. The LTO layer would etch rapidly in its as deposited state, but is densified during the oxidation cycle. At the termination of the etch of oxide layer 34, a portion of oxide layer 28 still overlays the base contact electrodes 26. Following this etch, a portion of the surface of surface area 14 as well as a portion of the surface of polycrystalline silicon layer 36 are exposed.

In accordance with the invention, a polycrystalline silicon emitter contact 48 and a polycrystalline silicon gate electrode 50 are formed by the process of selective deposition onto the exposed surfaces of surface area 14 and polycrystalline silicon layer 36. Selective deposition is a process of chemical vapor deposition in which the deposition parameters are adjusted, in known manner, so that the deposition takes place only upon a prepared nucleating surface. In the present embodiment, polycrystalline silicon deposits only on the monocrystalline and polycrystalline silicon surfaces. Selectively deposited polycrystalline silicon does not deposit on the nitride barrier layer 42, oxide layer 28, nor on sidewall spacers 44. As stated previously, the sidewall spacers must be formed of a material such as silicon nitride which will not act as a nucleating site for the selective deposition of silicon. In this manner a small polycrystalline silicon emitter electrode 48 is formed in self alignment with polycrystalline silicon base contact electrodes 26. The electrodes are formed in self aligned manner without resort to critical photolithographic processing.

Conductivity determining impurities are ion implanted into polycrystalline silicon emitter contact electrode 48 and then are diffused out of that polycrystalline silicon and into the underlying surface area 14 to form an intrinsic base region 52 and emitter region 54. For example, P type ions such as boron ions and N type ions such as phosphorus or arsenic ions are implanted into polycrystalline silicon electrode 48. After a thermal diffusion or redistribution, the P type ions form intrinsic base region 52 and the N type ions form emitter region 54. The ions are selectively implanted into the emitter electrode by masking other parts of the device structure, for example with photoresist. At the same time the N type ions are implanted into the emitter electrode to eventually form the emitter region, the same ions can be implanted into polycrystalline silicon gate electrode 50 to increase the conductivity of that electrode. Alternatively, gate electrode 50 can be conductivity doped during a separate ion implantation step or during the subsequent doping of the source and drain regions.

Figure 8:
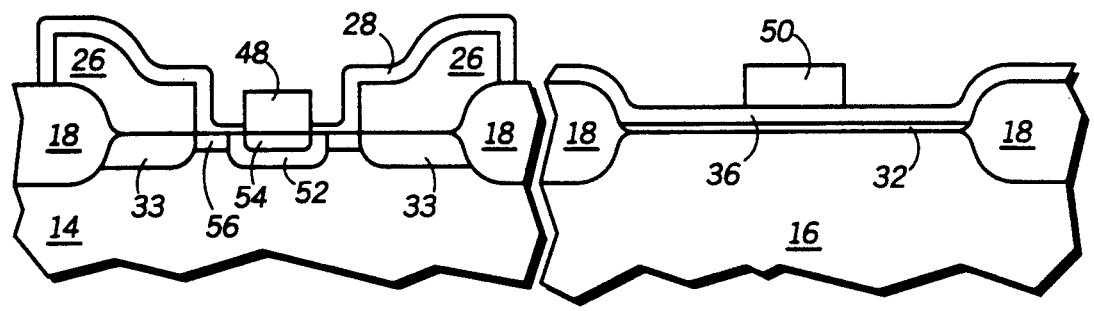

The process for forming a bipolar transistor, in accordance with the invention, is completed by removing the silicon nitride sidewall spacers 44. Preferably this done in a wet etchant such as hot phosphoric acid, but the silicon nitride can also be removed by plasma etching. At the same time sidewall spacers 44 are removed, silicon nitride barrier layer 42 is also removed from its position overlaying portions of the MOS transistor. With the sidewall spacers removed, and with a photoresist mask (not shown) overlaying and protecting the MOS transistor, P type ions are implanted into surface area 14 using polycrystalline silicon emitter electrode 48 and polycrystalline silicon base contact electrode 26 as ion implantation masks. This implantation forms a base linking region 56 which couples intrinsic base 52 with extrinsic base 33 as illustrated in FIG. 8. This completes the fabrication of the NPN bipolar transistor, except for possible anneals of the ion implantation, the provision of overlaying protective dielectric films, the provision of metallic contacts to the polycrystalline silicon contact electrodes, and other processing steps which are conventional in the fabrication of integrated circuit devices.

The N channel MOS transistor can now be completed, for example, as described in the above referenced copending application. The steps include, for example, the implantation of N type impurities to form lightly doped N type source and drain region aligned to the edges of polycrystalline silicon gate electrode 50. This is followed by the deposition of a sidewall spacer forming material and the anisotropic etching of that material to form sidewall spacers on the edges of gate electrode 50. The etching of the sidewall spacer material stops on the thin polycrystalline silicon layer 36. Thin polycrystalline silicon layer 36 is then subsequently removed selectively using the gate electrode 50 and the sidewall spacers as etch masks to expose the underlying gate oxide 32. The process then continues in conventional manner with the steps of forming heavily doped source and drain regions in alignment with the edges of the sidewall spacers and with other conventional MOS integrated circuit processing steps. During these steps used to complete the MOS transistor, the bipolar transistor can be protected form the process steps, for example by a layer of LTO which, in turn, is protected from the etching steps by a layer of photoresist.

Thus it is apparent that there has been provided, in accordance with the invention, a process for forming bipolar transistors, and especially bipolar transistors in combination with MOS transistors to form a BiMOS device, which fully meets the objects and advantages set forth above. Although the invention has been described and illustrated with reference to specific embodiments thereof, it is not intended that the invention be limited to these illustrative embodiments. Those skilled in the art will recognize that many variations and modifications are possible without departing from the spirit of the invention. For example, other doping techniques besides ion implantation can be used to dope the various device regions. Additionally, other insulating materials than those described and other methods for depositing those insulating materials besides chemical vapor deposition can be used. Still further, the described process can be used to form PNP or NPN transistors or both, either alone or in combination with N channel, P channel, or CMOS transistors. As previously noted, the term "polycrystalline silicon" has been used to encompass both polycrystalline or amorphous silicon. Accordingly, it is intended to encompass within the invention all such variations and modifications as fall within the scope of the appended claims.

What I claim is:

1. A method for fabricating a bipolar transistor comprising:
    providing a silicon substrate having a surface area of first conductivity type;
    depositing a silicon layer of second conductivity type overlaying said surface area;
    patterning said silicon layer to expose a first portion of said surface area and leaving a remaining portion of said silicon layer in contact with a second portion of said surface area adjacent said exposed portion, said remaining portion terminating at a sidewall;
    forming an electrically insulating layer overlaying said remaining portion and said first exposed portion;
    forming sidewall spacers of a material different from said electrically insulating layer overlaying said electrically insulating layer on said sidewall;
    etching said electrically insulating layer using said sidewall spacers as an etch mask to expose a third portion of said surface area, said third portion interior to said first portion and bounded by said sidewall spacers;
    depositing silicon on said third portion by a process of selective deposition;
    doping said surface area overlaid by said selectively deposited silicon with dopant impurities of second conductivity determining type to form an intrinsic base region and with dopant impurities of first conductivity type to form an emitter region;
    diffusing dopant impurities of second conductivity type from said silicon layer of second conductivity type into said second portion of said surface area to form an extrinsic base region;
    removing said sidewall spacers to expose a forth portion of said surface area; and
    doping said forth portion with conductivity determining dopant impurities of second conductivity type to form a linking base region connecting said intrinsic and extrinsic base regions.

2. The process of claim 1 wherein said step of depositing a silicon layer comprises the step of depositing a layer of insitu doped P-type polycrystalline silicon.

3. The process of claim 1 wherein said step of forming an electrically insulating layer comprises the step of chemical vapor depositing a layer of low temperature oxide.

4. The process of claim 3 wherein said step of forming sidewall spacers comprises the steps of:
    depositing a layer of silicon nitride; and anisotropically etching said layer of silicon nitride.

5. A method for fabricating a BiMOS device comprising the steps of:
- providing a semiconductor substrate having a first area for fabricating an MOS device and a second area for fabricating a bipolar device;
- providing a gate insulator and a nucleating layer overlaying said first area;
- providing base contacts having sidewalls overlaying said second area and defining a first portion of said second area;
- providing a masking layer overlaying said nucleating layer, said base contacts, and said first portion of said second area;
- selectively etching said masking layer to leave said masking layer overlaying unselected portions of said nucleating layer and leaving exposed other selected portions of said nucleating layer and to form sidewall spacers on said sidewalls of said base contacts and to define an active area of said first portion;
- depositing a silicon layer by a process of selective deposition on said other selected portions of said nucleating layer to form a gate electrode of said MOS device and on said active area to form an emitter contact;
- selectively introducing first and second conductivity determining dopant impurities into and through said emitter contact to dope an intrinsic base region and an emitter region;
- removing said sidewall spacers to expose an intermediate area of said first portion;
- introducing third conductivity determining dopant impurities into said intermediate area of said first portion to form a linking base; and
- introducing fourth conductivity determining dopant impurities into said first area and aligned with said gate electrode to form source and drain regions of said MOS device.

6. A method for fabricating a bipolar transistor comprising:
- providing a silicon substrate having a surface area of first conductivity type;
- forming a base contact electrode overlaying and contacting a portion of said surface area, said base contact electrode terminating at a sidewall;
- forming a sidewall spacer overlaying said sidewall and masking a first portion of said surface area and leaving exposed a second portion of said surface area;
- depositing a layer of silicon by a process of selective deposition onto said exposed second portion of said surface area to form an emitter electrode spaced apart from said base contact electrode by said sidewall spacer;
- introducing conductivity determining dopant impurities into said second portion of said surface area to form an intrinsic base region;
- removing said sidewall spacer to expose a third portion of said surface area; and
- introducing conductivity determining dopant impurities into said third portion of said surface area to form a linking base coupling said intrinsic base and said base contact electrode.

7. The method of claim 6 wherein said step of forming a base contact comprises the steps of:
- depositing a layer of polycrystalline silicon overlaying said silicon substrate;
- depositing a layer of oxide overlaying said layer of polycrystalline silicon; and
- patterning said layers of polycrystalline silicon and oxide.

8. The method of claim 6 further comprising the step of heating said silicon substrate to form a layer of thermal oxide before said step of forming a sidewall spacer.

9. The method of claim 8 wherein said step of forming a sidewall spacer comprises the steps of:
- depositing a layer of silicon nitride overlaying said layer of thermal oxide;
- anisotropically etching said layer of silicon nitride; and etching a portion of said layer of thermal oxide exposed by said step of anisotropically etching.

10. The process of claim 6 wherein said step of introducing conductivity determining dopant impurities into said second portion comprises the step of ion implanting dopant impurities into said emitter electrode.

* * * * *